(12) United States Patent
Evans et al.

(10) Patent No.: US 8,036,300 B2
(45) Date of Patent: Oct. 11, 2011

(54) DUAL LOOP CLOCK RECOVERY CIRCUIT

(75) Inventors: William P. Evans, Catonsville, MD (US); Eric Naviasky, Ellicott City, MD (US)

(73) Assignee: Rambus, Inc., Los Altos, CA (US)

( * ) Notice: Subject to any disclaimer, the term of this patent is extended or adjusted under 35 U.S.C. 154(b) by 0 days.

(21) Appl. No.: 12/456,078

(22) Filed: Jun. 11, 2009

(65) Prior Publication Data
US 2009/0257542 A1    Oct. 15, 2009

Related U.S. Application Data

(63) Continuation of application No. 11/177,095, filed on Jul. 8, 2005, now Pat. No. 7,587,012.

(60) Provisional application No. 60/586,867, filed on Jul. 8, 2004.

(51) Int. Cl.
*H04B 7/02* (2006.01)
*H04L 7/00* (2006.01)
*G06J 1/00* (2006.01)

(52) U.S. Cl. ............... 375/276; 375/372; 708/3

(58) Field of Classification Search .......... 375/276, 375/372
See application file for complete search history.

(56) References Cited

U.S. PATENT DOCUMENTS

| | | | |
|---|---|---|---|
| 5,258,933 A * | 11/1993 | Johnson et al. ............. 708/3 |
| 5,341,249 A * | 8/1994 | Abbott et al. .............. 360/46 |
| 5,552,942 A * | 9/1996 | Ziperovich et al. ......... 360/51 |
| 5,867,544 A | 2/1999 | Taniguchi |
| 5,937,020 A | 8/1999 | Hase et al. |
| 5,990,714 A | 11/1999 | Takahashi et al. |
| 6,191,906 B1 * | 2/2001 | Buch ...................... 360/51 |
| 6,580,304 B1 | 6/2003 | Rieven |
| 6,617,936 B2 | 9/2003 | Dally et al. |
| RE38,482 E | 3/2004 | Leung et al. |
| 6,861,916 B2 | 3/2005 | Dally et al. |
| 6,914,465 B2 | 7/2005 | Kiyose et al. |
| 6,950,956 B2 | 9/2005 | Zerbe et al. |
| 2002/0037065 A1 | 3/2002 | Nakamura |
| 2002/0075980 A1 * | 6/2002 | Tang et al. ............... 375/372 |
| 2002/0105386 A1 | 8/2002 | Shastri |
| 2003/0025539 A1 * | 2/2003 | Fiscus ..................... 327/158 |
| 2003/0035502 A1 | 2/2003 | Boerker |

(Continued)

OTHER PUBLICATIONS

"Monolithic Phase-Locked Loops and Clock Recovery Circuits, Theory and Design," Behzad Razavi, ed., IEEE Press (1994), pp. 33-35.

(Continued)

*Primary Examiner* — Shuwang Liu
*Assistant Examiner* — Sarah Hassan
(74) *Attorney, Agent, or Firm* — Holland & Knight LLP; Brian J. Colandreo, Esq.; Mark H. Whittenberger, Esq

(57) ABSTRACT

A clock recovery circuit for digital data transmission includes a delay lock loop having a first loop which generates a phase difference signal which is indicative of a quantized phase difference between a data signal and a clock signal; and a second loop which generates a phase difference signal which is a smooth, continuous function of the phase difference between the data signal and the clock signal, such as a phase difference signal which is proportional to the phase difference. The delay lock loop may include two phase shifters in series, and one or both of these may include a phase interpolator.

34 Claims, 7 Drawing Sheets

U.S. PATENT DOCUMENTS

| | | | |
|---|---|---|---|
| 2003/0103591 | A1 | 6/2003 | Noguchi |
| 2004/0052323 | A1 | 3/2004 | Zhang |
| 2004/0141577 | A1 | 7/2004 | Brunn et al. |
| 2004/0202266 | A1* | 10/2004 | Gregorius et al. ............ 375/355 |
| 2004/0223575 | A1* | 11/2004 | Meltzer et al. ................ 375/376 |
| 2005/0231249 | A1 | 10/2005 | Tani |

OTHER PUBLICATIONS

Gursoy, Zafer Ozgur (ST Microelectronics), and Yusuf Leblebici (Swiss Federal Inst. Of Tech.—Lausanne), "Design and Realization of a 2.4 Gbps—3.2 Gbps Clock and Data Recovery Circuit Using Deep-Submicron Digital CMOS Technology."

Sidiropoulos, Stefanos and Mark Horowitz, "SA20.2: A Semi-Digital DLL with Unlimited Phase Shift Capability and 0.08-400MHz Operating Range," Center for Integrated Systems, Stanford Univ., Stanford, CA, mos.stanford.edu.\papers\ss_1sscl_97.pdf.

Kim, Dong-Hee and Jin-Ku Kang, "A 1.0-Gbps Clock and Data Recovery Circuit with Two-XOR Phase-Frequency Detector," Dept. of Electrical and Computer Engineering, Inha Univ., Inchon, Korea.

Hogge, Jr., Charles R., "A Self Correcting Clock Recovery Circuit," J. of Lightwave Tech., vol. LT-3, No. 6, Dec. 1985.

Song, Yeo-San and Jin-Ku Kang, "A Delay Locked Loop Circuit With Mixed-Mode Tuning," Dept. of Electrical and Computer Engineering, Inha Univ., Inchon, Korea.

Lee, Haechang, Chi Ho Yue, Samuel Palermo, Kenneth W. Mai, and Mark Horowitz, "Burst Mode Package Receiver using a Second Order DLL," Center for Integrated Systems, Stanford Univ., Stanford, CA.

Lee, Thomas H., "A 155-MHz Clock Recovery Delay- and Phase-Locked Loop," IEEE J. of Solid-State Circuits, vol. 27, No. 12, Dec. 1992.

Wong, Koon-Lun Jackie, Hamid Hatamkhani, and Mozhgan Mansuri, "A 27-mW 3.6-Gb/s I/O Transceiver," IEEE J. of Solid-State Circuits, vol. 39, No. 4, Apr. 2004.

Toifl, Thomas, Christian Menolfi, Peter Buchmann, Marcel Kossel, Thomas Morf, Robert Reutemann, Michael Ruegg, Martin Schmatz, and Jonas Weiss, "0.94ps-rms-Jitter 0.016mm$_2$ 2.5GHz Multi-Phase Generator PLL with 360° Digitally Programmable Phase Shift for 10Gb/s Serial Links," 2005 IEEE Int'l Solid-State Circuits Conference.

Emami-Neyestanak, Azita, Samuel Palermo, Hae-Chang Lee and Mark Horowitz, "CMOS Transceiver with Baud Rate Clock Recovery for Optical Interconnects," Computer Systems Lab., Stanford, CA.

Larsson, Patrick, "A 2-600-MHz CMOS Clock Recovery PLL with Low-V$_{dd}$ Capability," IEEE J. of Solid-State Circuits, vol. 34, No. 12, Dec. 1999.

Kim, Jaeha and Mark A. Horowitz, "Adaptive Supply Serial Links With Sub-1-V Operation and Per-Pin Clock Recovery," IEEE J. of Solid-State Circuits, vol. 37, No. 11, Nov. 2002.

Song, Yeo-San et al., A Delay Locked Loop Circuit with Mixed Mode Phase Tuning Technique, IEICE Trans. Fundamentals, vol. E83-A, No. 9, Sep. 2000.

Gursoy, Zafer Ozgur, and Yusuf Leblebici, "Design and Realization of a 2.4 Gbps—3.2 Gbps Clock and Data Recovery Circuit Using Deep-Submicron Digital CMOS Technology."

A fully integrated 43.2-Gb/s clock and data recovery and 1:4 DEMUX IC in InP HBT technology Nielsen, S., Yen, J.C.; Srivastava, N.K.; Rogers, J.E.; Case, M.G.; Thiagarajah, R.; Solid-Sate Circuits, IEEE Journal of, vol. 38, Issue 12, Dec. 2003, pp. 2341-2346.

* cited by examiner

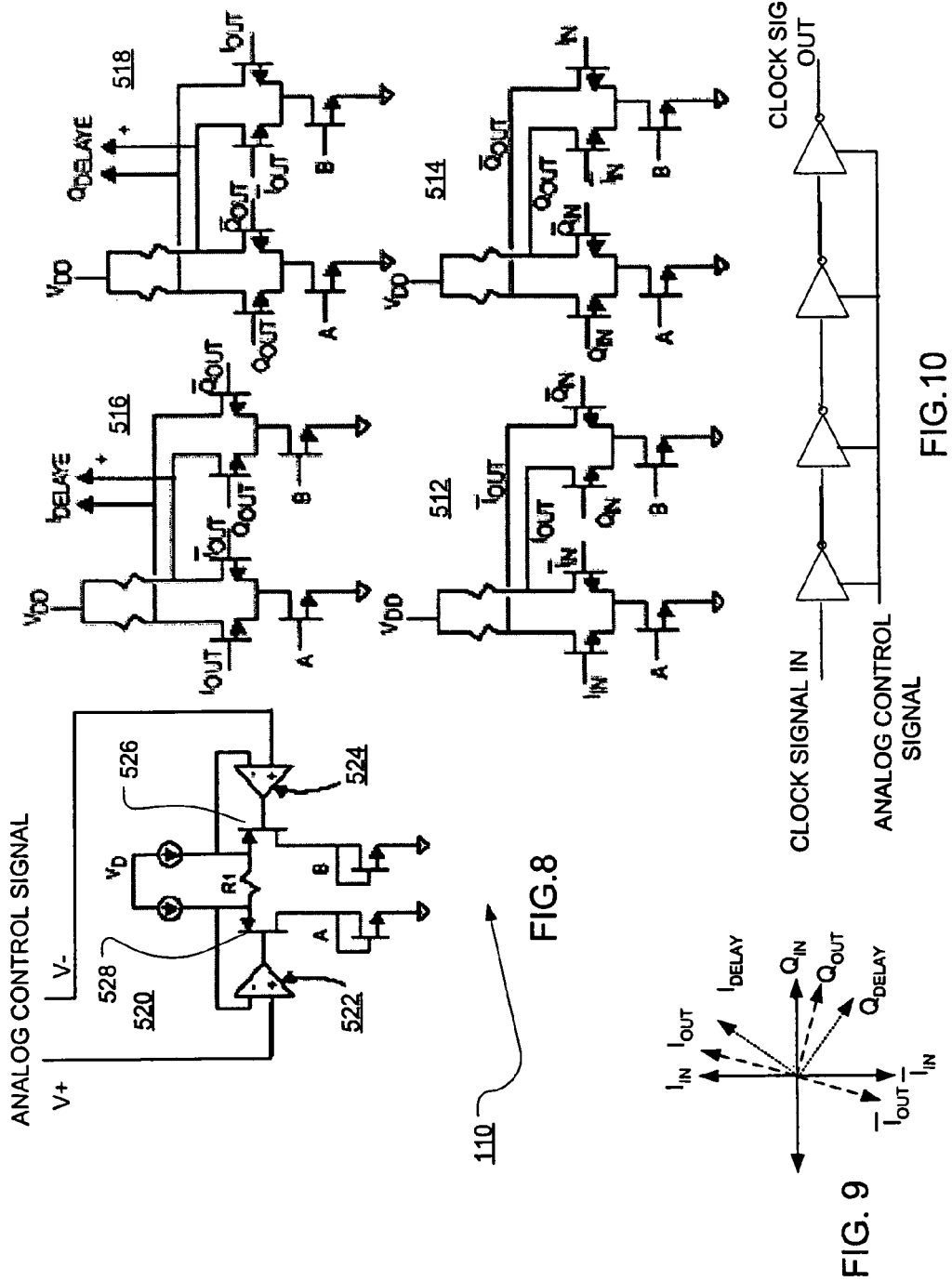

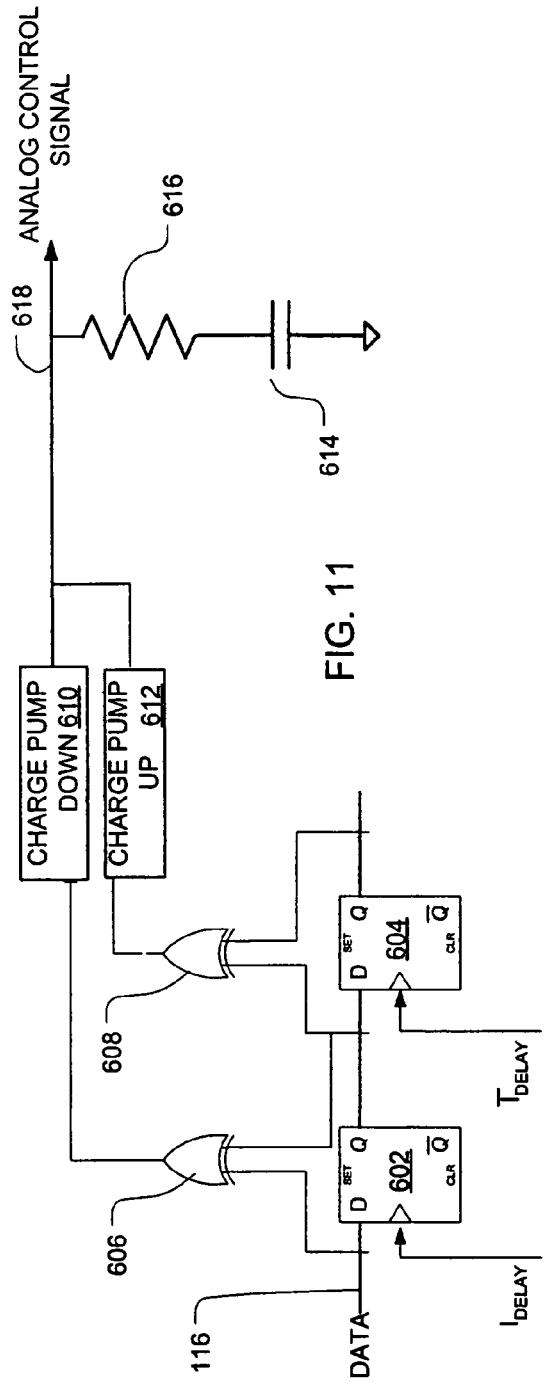
FIG. 11
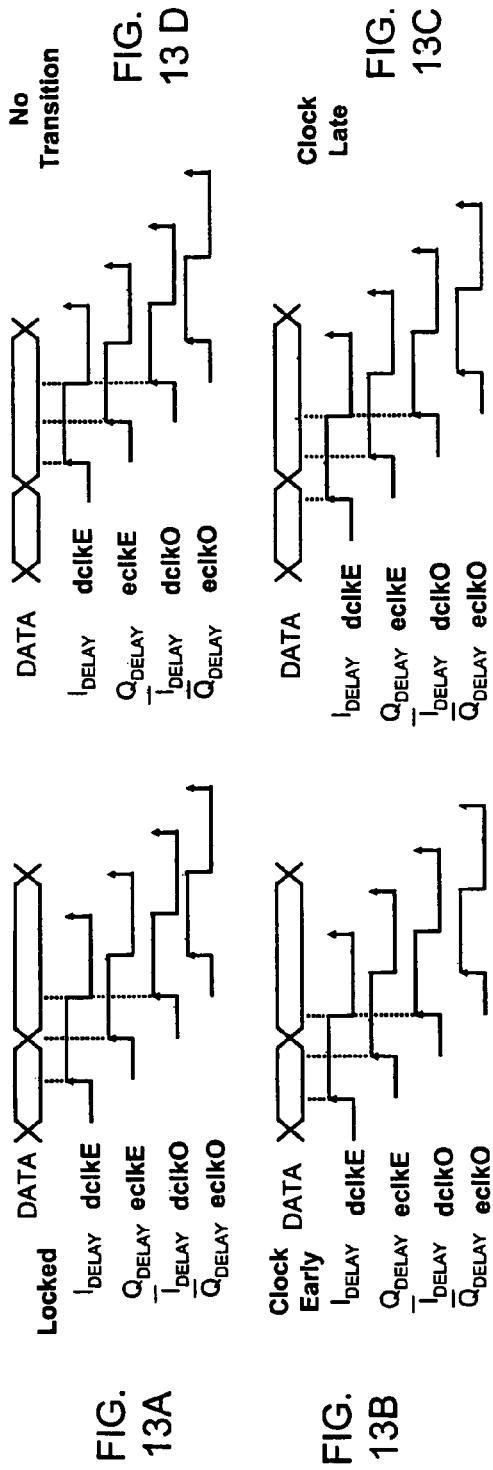
FIG. 13A  Locked
FIG. 13B  Clock Early
FIG. 13C  Clock Late
FIG. 13D  No Transition

DUAL LOOP CLOCK RECOVERY CIRCUIT

CROSS-REFERENCE TO RELATED APPLICATIONS

This application is a continuation of U.S. application Ser. No. 11/177,095 filed on Jul. 8, 2005 which claims the benefit of the filing date of U.S. Provisional Patent Application No. 60/586,867 filed Jul. 8, 2004, the disclosures of which are hereby incorporated herein by reference.

BACKGROUND OF THE INVENTION

Digital devices as, for example, circuits within a computer, send information to one another by varying a parameter of a signal as, for example, an electrical voltage, during successive intervals set by a clock in the sending device. In a binary system, the sending device sets the signal parameter for each interval either to a first value to denote a 1 or a second value to denote a 0 during each interval. The receiving device takes successive samples of the signal at times corresponding to the intervals in the signal and determines, for each such sample, whether the parameter denotes a "0" or a "1." To do this, the receiving device must have a clock signal synchronized with the intervals in the incoming data signal. If the clock used by the receiving device is out of synchronization with the intervals of the data signal, data can be lost or misinterpreted. To communicate data at high speed, it is desirable to make the data intervals as short as possible, which, in turn, requires greater precision in the synchronization between the clock signal used by the receiving device and the data intervals of the incoming signal. For example, modern interfacing and communication protocols such as PCI Express, SONET, InfiniBand and XAUI use data intervals on the order of nanoseconds or less and require that the receiving device use a clock synchronized to the data intervals to within fractions of a nanosecond.

BRIEF DESCRIPTIONS OF THE DRAWINGS

FIG. 4 is a functional block diagram of a monolithic integrated circuit incorporating a plurality of circuits.

FIG. 8 is a schematic view of a further phase shifter usable in the embodiment of FIG. 1.

FIG. 9 is a phase diagram showing the relative phases of certain signals in the phase shifter of FIG. 8.

FIG. 10 is a schematic diagram of a further phase shifter usable in the embodiment of FIG. 1.

FIG. 11 is a schematic, partially block diagrammatic view of one analog phase detector and analog loop filter usable in the embodiment of FIG. 1.

FIGS. 13A-13D are graphs depicting timing relationships between signals in different operating conditions of the phase detector and loop filter of FIG. 12.

DETAILED DESCRIPTION

Figure 1:
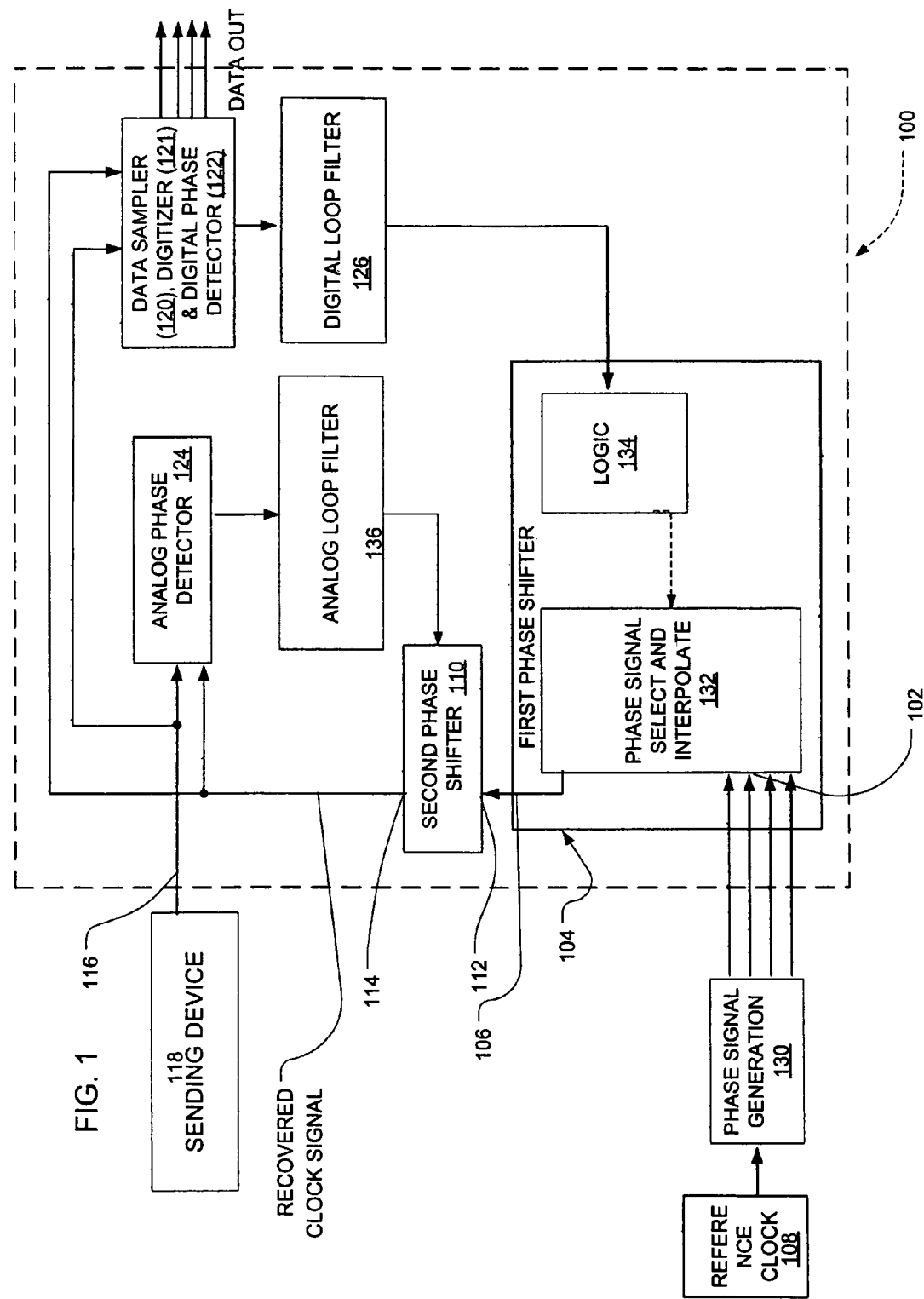
FIG. 1 is a functional block diagram of a clock recovery circuit in accordance with one embodiment of the invention.

A clock and data recovery circuit according to one embodiment is shown in block diagrammatic form in FIG. 1. The circuit includes a delay lock loop 100. Delay lock loop 100 includes a first phase shifter 104 having a clock input 102 and an output 106. Clock input 102 is arranged to receive a clock signal, referred to herein as the "input clock signal" from a source external to the delay lock loop 100. In this embodiment, the clock input 102 is arranged to accept the input clock signal in the form of a plurality of signal components, referred to herein as "phase signals," which are of equal frequency but offset in phase relative to one another. Most preferably, the phases of the phase signals are distributed equally over a full 360° phase shift range (one full period) as, for example, a first phase signal arbitrarily designated as a 0° phase signal and three other phase signals at 90°, 180°, and 270° phase delay relative to the 0° phase signal.

As further discussed below, first phase shifter 104 is arranged to alter the phase of the input clock signal supplied at clock input 102 by a controllable amount and supply a replica of the input clock signal with the altered phase at output 106. The delay lock loop further includes a second phase shifter 110 having an input 112 and an output 114. The second phase shifter 110 is also arranged to alter the phase of a clock signal passing from input 112 to output 114. The two phase shifters are connected in series, so that a signal applied at clock signal input 102 will be converted to a phase shifted replica referred herein as an intermediate signal at the output 106 of first phase shifter, which, in turn, is applied to the input 112 of the second phase shifter 110. The second phase shifter produces a phase shifted replica of the intermediate signal, referred to herein as a recovered clock signal, at output 114. The recovered clock signal, thus, is a phase shifted replica of the input clock signal applied at clock input 102; the phase shift of the recovered clock signal relative to the input clock signal is simply the sum of the phase shifts applied by the two phase shifters 104 and 110. The intermediate signal and the recovered clock signal may include plural components differing in phase from one another.

The delay lock loop 100 further includes a data signal input 116 for receiving a serial data signal from a sending device 118 outside of the delay lock loop 100. In some embodiments, the data signal supplied at input 116 and the recovered clock signal from output 114 are applied to a data sampling device 120 which is arranged to sample the data stream at times defined by the recovered clock signal from output 114 and to provide the sampled data to other circuits. In some embodiments, the delay locked loop may also include a deserializer 121 arranged to serial data to parallel data. To maximize the accuracy of data sampled by the data sampling device 120, the recovered clock signal must be synchronized, as closely as practical, with the data intervals in the data signal supplied to input 116.

Delay lock loop 100 further includes a first phase detector which, in the embodiment depicted in FIG. 1, is a digital phase detector 122. In the embodiment depicted in FIG. 1, a data sampling device 120 and deserializer 121 are combined with the digital phase detector 122. In other embodiments, the data sampling device and/or the deserializer may be separate components, or may be omitted. Delay lock loop 100 further includes a second phase detector 124 which, in this embodiment, is an analog phase detector. Each of these phase detectors is connected to the data signal input 116 and to the recovered clock signal output 114. Each phase detector is arranged to compare the phase of the recovered clock signal with the phase of the data signal applied at input 116.

Figure 2:
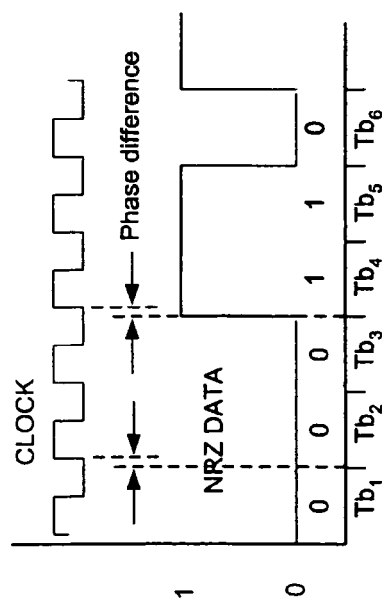
FIG. 2 is a graph depicting certain signals versus time.

As used in this disclosure, the term "data signal" refers to a signal which has defined data intervals and which has a value within each data interval set by the sending device to represent information to be conveyed. To the receiving device, it may appear that the value of the data signal within each data interval has zero correlation with the value in each other data interval. For example, the serial binary non-return-to-zero ("NRZ") data signal shown in FIG. 2 has numerous equal data intervals $T_b$, also referred to as "bit intervals." The signal of FIG. 2 is conveying the binary information sequence "000110," and accordingly, the voltage or other parameter of the signal has the value denoting binary 0 in the intervals $T_{b1}$ through $T_{b3}$, the value denoting binary 1 in the intervals $T_{b4}$ and $T_{b5}$ and so on, according to the information to be conveyed. Transitions between 0 and 1 values can occur only at the boundaries between bit intervals, but do not occur at every boundary. For example, at the boundary between bit interval $T_{b3}$ and $T_{b4}$, there is a low-to-high transition; at the boundary between $T_{b2}$ and $T_{b3}$, there is no transition. By contrast, a clock signal, also shown in FIG. 2, is a substantially periodic signal having transitions recurring in every period or once in every N period, where N is a positive integer. The period of the clock signal depicted in FIG. 2 is equal to one data interval $T_b$. Other implementations may use clock signals having plural components. For example, each component can have a period equal to two data intervals.

As referred to in the present disclosure, the "phase difference" between a clock signal and a data signal is the time difference between an arbitrarily selected feature of the clock waveform and the nearest boundary between data intervals of the data waveform. In the example of FIG. 2, if the rising edge of the clock signal is selected as the arbitrary point on the waveform for phase measurement, the phase difference can be represented by the time delay between the rising edge and the next adjacent transition. As illustrated in FIG. 2, the phase difference exists regardless of whether there is a transition in the data at the particular boundary. However, the phase difference can be measured only at those boundaries where a transition exists. For example, in FIG. 2, the data signal has the same value (low or 0) in $T_{b1}$ and $T_{b2}$; there is no way to detect the boundary between intervals $T_{b1}$ and $T_{b2}$ by examining the value of the data signal. Thus, phase detectors which are capable of detecting a phase difference between a clock signal and a data signal typically include circuits which detect or respond to transitions or edges in the value denoted by the data signal. As used in this disclosure, the term "clock recovery" refers to the process of adjusting the phase of a clock based upon observation of a data signal, as distinguished from observation of another clock signal. The term "clock and data recovery" refers to the process of performing clock recovery and using the recovered clock signal to sample the data signal and thereby recover data values from the data signal. The term "clock recovery circuit" refers to a circuit which is capable of performing clock recovery.

The first phase detector is arranged to provide a signal representing a quantized phase difference between the recovered clock signal and the data signal. In the embodiment depicted in FIG. 1, the first phase detector is digital phase detector 122. Digital phase detector 122 is arranged to provide a digital signal representing the phase difference between the recovered clock signal and the data signal. The phase difference signal may be a binary signal having one value indicating that the clock signal is leading the data signal, and a second value indicating that the clock signal is lagging the data signal. In this case, the digital phase difference signal indicates only the sign of the phase difference, without any information as to its magnitude.

The first phase difference signal from the first or digital phase detector 122 is conveyed to a digital loop filter 126. Digital loop filter 126 processes the first or digital phase difference signal from detector 122 to derive a first, digital control signal for application to first phase shifter 104. This control signal represents the phase shift to be applied by the first phase shifter. The digital loop filter may include a register for storing the value of the first or digital control signal and appropriate circuits for incrementing or decrementing the stored value in response to the first or digital phase difference signal from detector 122, or a function of that signal. Where the digital loop filter is arranged to increment or decrement the stored control signal value directly in response to the first or digital phase signal, the digital loop filter may be characterized as a first order filter. Where the digital loop filter is arranged to integrate the first or digital phase difference signal over time and increment or decrement the control signal in response to the integral, it may be referred to as a second order digital loop filter. The digital loop filter 126 also may include a combination of these approaches.

Figure 3:
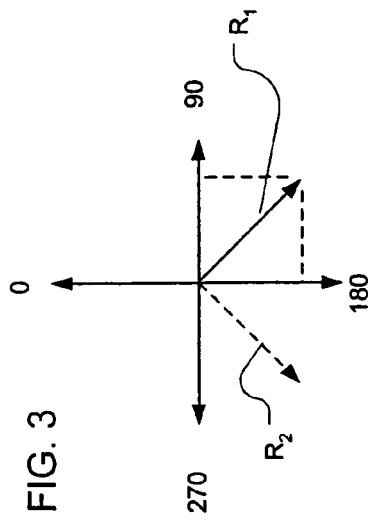
FIG. 3 is a phase diagram.

The first phase shifter 104 may include a phase signal selection and interpolation circuit 132 connected to the clock input 102 and to the output 106 of the phase shifter 104, as well as a logic unit 134. Logic unit 134 is connected to receive the first control signal from the first or digital loop filter 126. Phase signal selection and interpolation circuit 132 is arranged to select a set of phase signals from among the phase signals in the incoming clock signal. The magnitudes of the selected phase signals may be multiplied by coefficients to yield signals, which may be combined with one another to give the desired resultant. For example, in the particular case shown in FIG. 3, the phase signals in the incoming clock signal consist of four phase signals at, respectively, 0°, 90°, 180° and 270° phase angles. In this case, the set of phase signals included for any desired resultant phase angle includes the two phase signals having phase angles bracketing the desired resultant phase signal, and these selected phase signals are multiplied by coefficients equal to the cosines of the phase angles between the phase signals and the desired resultant. In the example shown in FIG. 3, the desired resultant $R_1$ has a phase angle intermediate between the 90° and 180° phase signals, and thus may be formed by multiplying each of these phase signals by an appropriate coefficient to give a product signal, and combining the product signals with one another. Stated another way, each phase signal has an active domain between the phase angles of the two neighboring phase signals. For any desired resultant phase angle within this active domain, the coefficient applied to the phase signal is non-zero. The coefficient is 0 for any other desired phase angle. For example, in the embodiment having four phase signals at 0°, 90°, 180° and 270°, the 180° phase signal has an active domain from 90° to 270°. The coefficient for the 180° phase signal is 1.0 at a desired resultant phase angle of 180°, and decreases continuously to 0 as the desired resultant phase angle approaches 90° or 270°. The coefficient of this phase signal is 0 outside this domain, i.e., for desired resultant phase angles of 0°-90° or 270°-360°. Where the desired intermediate signal includes plural components, each component is formed in the same manner. For example, an additional resultant $R_2$ offset 90° from the resultant $R_1$ discussed above can be formed by applying to the 180° and 270° phase signals the same coefficients applied to the 90° and 180° phase signals to form resultant R1.

Although the operations of selecting phase signals and combining the phase signals are conceptually separate, they may be performed at the same time and by the same physical elements; a phase signal which is multiplied by a non-0 coefficient may be characterized as selected, whereas a phase signal multiplied by a 0 coefficient, and hence making no contribution to the resultant, is deselected. The logic circuit 134 converts the desired phase angle into signals appropriate to control the components within the phase selection and interpolation circuit as discussed further below. The first phase shifter can provide any desired phase angle; the coefficients used to provide a desired phase angle greater than 360° are equal to those used to provide a phase angle equal to the remainder left after dividing the desired phase angle by 360°. Stated another way, the first phase shifter in this embodiment has an infinite range of phase shift.

The second phase detector is arranged to provide a signal representing the phase difference between the data signal and the recovered clock signal. In the embodiment depicted in FIG. 1, the second phase detector is an analog phase detector. Analog phase detector 124 desirably is arranged to detect transitions in the data signal and provide an analog signal representing the phase difference between the data signal and the recovered clock signal when such transitions occur. In some embodiments, this phase difference signal includes information both as to the sign of the phase difference (lead or lag) and as to the magnitude of the phase difference. The signals from the analog phase detector are routed to an analog loop filter 136, which desirably provides an analog control signal which represents the integral of the phase error over time.

Second phase shifter 110 desirably includes an analog delay line, such as a chain of inverters having delay directly related to an applied voltage, or, as further discussed below, one or more phase interpolators controlled by the applied analog control signal. The second or analog phase shifter 110 shifts the phase of the intermediate signal provided by the first phase shifter 104, and thus provides the recovered clock signal at output 114. Where the intermediate signal includes plural signal components, the second or analog phase shifter may be arranged to shift all or less than all of these components in the same manner. The second or analog phase shifter need not provide a full 360° range; a lesser range such as 90° or 180° typically will suffice.

In one embodiment, a delay lock loop includes two control loops: a first loop which provides quantized phase update information; and a second loop which provides phase update information. The second loop may be used to compensate for jitter introduced by the first loop. In some embodiments, the first loop is a digital loop and the second loop is an analog loop. In some embodiments, the first loop has a loop bandwidth which is higher than the loop bandwidth of the second loop. In some embodiments, the first loop has a loop delay which is longer than the loop delay of the second loop. In some embodiments, the first loop may be referred to as a "bang-bang" loop and the second loop may be referred to as a "proportional" loop.

In the embodiment depicted in FIG. 1, delay lock loop 100 includes two control loops: a first control loop including the first or digital phase detector 122, digital loop filter 126 and first phase shifter 104; and a second or analog control loop including the analog phase detector 124, analog loop filter 136 and second phase shifter 110. The two phase shifters are connected in series so that the effects of these control loops are additive. The delay lock loop 100 need not incorporate a voltage controlled oscillator or other controllable clock for generating the incoming clock signal, but instead can accept an externally generated clock signal. Thus, as shown in FIG. 4, several delay lock loops 100a, 100b, and 100c, each configured as discussed above, may be linked to a common source for an incoming clock signal. In the example shown in FIG. 4, all of the DLLs 100 are formed as elements or cells of a single monolithic integrated circuit 140 using, as conventional and known in the art, a circuit forming apparatus, such as a computer, which can include a computer readable medium encoded with information including a program readable and executable by the computer for controlling a semiconductor device fabrication assembly to form the DLLs 100 on the circuit 140. In this example, the plural phase signals constituting the incoming clock signal to each DLL 100 are formed by a single phase signal generation circuit 130, which in turn is connected via an off-chip connection 131 to a reference clock 108 outside of the integrated circuit. In other embodiments, the source of the incoming clock signal can include a reference clock generator on the monolithic circuit. Each delay lock loop provides a recovered clock signal with a phase matched to the phase of the data signal received by that particular delay lock loop, and independent of the phase of the recovered clock signal generated by any other delay lock loop. Therefore, the several delay lock loops and their associated data sampling units can receive data signals which differ in phase from one another. However, because only one reference clock is required, the beat frequency coupling and injection locking problems which can arise when multiple clocks such as multiple voltage controlled oscillators ("VCOs") are placed in close proximity to one another do not occur. This is particularly useful where the various delay lock loops and the reference clock are all formed as elements of a single monolithic integrated circuit 140.

The input clocks supplied to the delay lock loops need not be frequency locked to the clock defining the data intervals of the received data signal. As discussed above, each delay lock loop can vary the phase of the recovered clock signal generated by that delay lock loop over an infinite positive or negative range, allowing the DLL to compensate for differences in frequency between the input clock frequency and the frequency of the clock defining the data intervals of the received data signal. For example, where the interval frequency of the received data signal is slightly lower than the frequency of the input clock, the delay lock loop will continually increase the phase delay of the recovered clock signal relative to the input clock signal. This effectively reduces the frequency of the recovered clock signal to match the frequency of the received data signal. The opposite effect occurs if the frequency of the received data signal is slightly greater than the frequency of the input clock signal.

A phase shifter such as the first phase shifter 104 discussed above with reference to FIG. 1, which operates by receiving plural phase signals and interpolating between them, provides this ability in the delay lock loop. Control of such a phase shifter can be readily accomplished using a digital control loop. However, the delay lock loop 100, in its preferred embodiments, can provide phase tracking characteristics superior to those which could be accomplished using a digital control loop alone. The first or digital control loop (digital phase detector 122, digital loop filter 125 and first phase shifter 104) has an appreciable loop delay. As used in this disclosure, the term "loop delay" refers to the delay between the detection of a change in the phase difference between the recovered clock signal and the data signal, and a counteracting change in the phase provided by a phase shifter.

Figure 5:
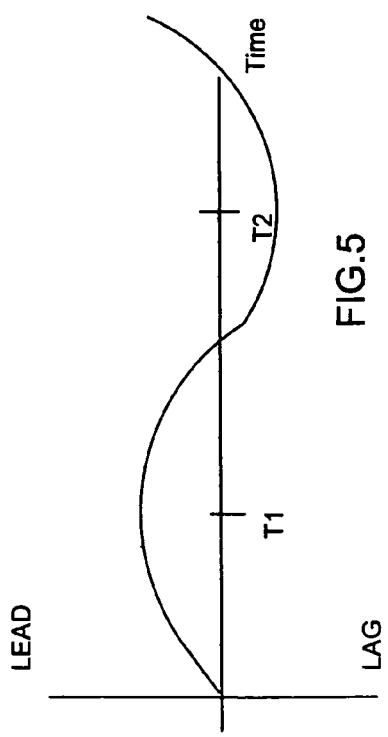
FIG. 5 is a graph schematically indicating variation of phase angle with time.

Loop delay can cause the delay lock loop to make inappropriate corrections in the phase of the recovered clock signal. For example, as shown in FIG. 5, the incoming data signal may be subject to variations in phase with time, commonly referred to as phase noise or jitter, so that the data signal first leads and then lags the recovered clock signal. A delay lock loop with loop delay may detect the lead at time T1 and attempt to advance the phase of the recovered clock signal to compensate for this lead. However, because of the loop delay, the correction is not made until time T2. At this time, the data signal is lagging the recovered clock signal. Therefore, advancing the phase of the recovered clock signal at time T2 aggravates the phase difference between the recovered clock signal and the data signal, rather than correcting it. This effect, if left uncorrected, can cause the phase of the recovered clock signal to continually swing between leading and lagging the received data signal, and hence can introduce jitter into the recovered clock signal. This effect may be particularly pronounced where the phase of the received data signal changes at a particular frequency. Pronounced sensitivity to phase changes in the received data signal at a particular frequency which causes larger recovered clock jitter than data signal jitter is referred to herein as "jitter peaking."

Moreover, the binary phase difference signal supplied by the digital phase detector also tends to introduce jitter even where the received data signal has a constant phase. Noise in the received data signal can cause lead and lag detection errors, so that the binary phase difference signal indicates that the recovered clock signal is leading the data signal when it is actually lagging or vice-versa. As further explained below, errors of this type are more likely to occur when the recovered clock signal is close to an exact phase lock with the received data signal.

Further, the digital control loop necessarily changes the phase delay stepwise. Such a digital loop is sometimes referred to as a bang-bang control loop. In a bang-bang loop, phase corrections of a fixed size are provided regardless of the size of the detected phase differences. If the recovered clock signal is lagging the received data signal before such a step, it may lead after such a step. Alternatively, the step size may not be big enough to fully compensate for the detected phase difference between the input data intervals and the recovered clock. In such cases, the digital loop is slew limited and can fail to provide a recovered clock with a phase matching that of the received data signal.

In the delay lock loop discussed above, however, the analog control loop compensates for these characteristics of the digital control loop. The analog control loop desirably has a loop delay considerably shorter than the loop delay of the digital control loop. Furthermore, the analog control loop, sometimes referred to as a proportional control loop, can provide phase corrections which are directly proportional to the detected phase differences. Thus, the analog control loop can compensate for the tendency of the digital control loop to introduce jitter and jitter peaking. The analog loop can also compensate for the slew limited behavior of the digital loop since the analog loop can be designed to accommodate a much larger phase slew rate, although typically only over a limited phase range. This characteristic is often denoted by referring to the analog loop as having a high control bandwidth. Stated another way, the two control loops, with their phase shifters in series, provide a means for altering the phase of the recovered clock signals so that a transfer function which relates the alteration in phase of the recovered clock signal with the difference in phase between the recovered clock signal and the received data signal represents a combination of two components. The first component, typically imparted by the first or digital control loop, has a phase alteration which varies in response to a function of the phase difference, with a first loop delay or delay between the change in the phase difference and a change in the phase alteration. The second component, typically imparted by the analog control loop, has a phase alteration which varies in response to the phase difference, with a second loop delay less than the first loop delay. The first or digital loop may provide infinite phase correction range but typically does so in a non-proportional, stepwise, slew limited fashion with a relatively high loop delay or latency. The second or analog loop may provide only a limited phase correction range but can do so in a manner proportional to the detected phase difference and with a lower effective loop delay or latency such that it accommodates higher phase slew rates and is characterized as having a high control bandwidth. In other embodiments, the second or analog control loop may provide phase correction which varies smoothly with the phase difference or with a function of the phase difference, so that the first derivative of the phase correction with respect to the phase difference is a continuous function of the phase difference.

In the arrangement shown in FIG. 1, the delay lock loop provides the reference clock signal to only one data sampling device, and the data sampling device is integrated with the digital phase detector. However, where several data sampling devices such as plural deserializers receive plural data signals and the data intervals of these plural signals are synchronized with one another, the recovered clock signal from a single delay lock loop can be provided to plural data sampling devices sampling these data signals. For example, in FIG. 4, the recovered clock signal from delay lock loop 10c is provided to data sampling devices 120c, 120c' and 120c". Also, the data sampling device and digital phase detector need not be integrated with one another but instead may be separate circuit elements. Indeed, it is not essential to provide a data sampling device connected to the data signal input of the delay lock loop. In the arrangement of FIG. 4, data sampling device 120c may be omitted. In this case, the information conveyed by the signal supplied to delay lock loop 100c is not recovered, but the information sent to data sampling units 120c' and 120c" is recovered. In such an arrangement, the signal received by delay lock loop may be either a data signal or a clock signal with a periodic pattern of 1's and 0's. Stated another way, a delay lock loop 100 which is capable of performing clock recovery from a data signal typically can also work with a clock signal.

The components depicted in FIG. 1 are shown in functional, block diagram form. The same physical elements which are used to constitute one component may also serve as physical elements of another functional component. For example, data sampling device the digital phase detector 122 may be combined with a data sampling device. The data sampling device may incorporate one or more latches which may also form a portion of the digital phase detector.

Figure 6:
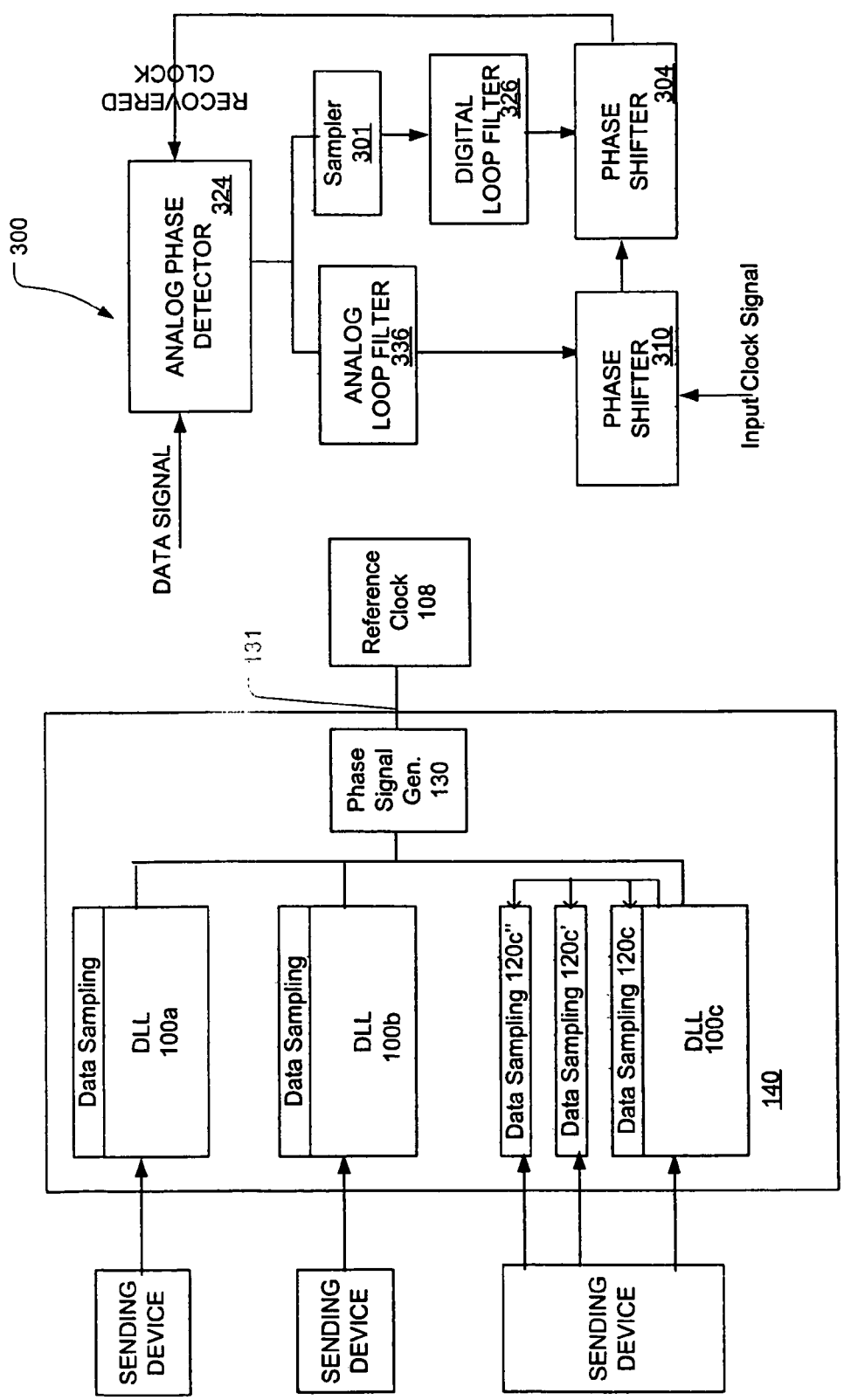
FIG. 6 is a functional block diagram of a delay lock loop in accordance with a further embodiment of the invention.

As depicted in FIG. 6, a delay lock loop according to a further embodiment utilizes only a single analog phase detector 324, which provides an analog phase difference signal to a sampler 301. Sampler 301 provides a digitized version of the phase difference signal to a digital loop filter 326. In one embodiment, the digitized version of the phase difference signal that the sampler 301 provides is simply indicative of whether the data signal leads or lags the recovered clock signal. In other embodiments, sampler 301 may provide a digitized version of the phase difference signal which contains, in addition to information regarding whether the data signal leads or lags the recovered clock signal, information that is indicative of the amount of phase difference between the data signal and the recovered clock signal. The digital loop filter provides a digital control signal to the first phase shifter 304. The analog phase detector 324 also provides the analog phase difference signal to an analog loop filter 336, which, in turn, provides the analog control signal to the second phase shifter 310. In this embodiment, as in the embodiment of FIG. 1, the first and second phase shifters are connected in series, so that the input clock signal passes through both phase shifters in order, to form the recovered clock signal. In this embodiment, however, the phase shifters are connected in the reverse order from that shown in FIG. 1; the output of the analog loop filter 336 and the input clock signal are input into the second phase shifter 310, and the output of the second phase shifter 310 and the output of the digital loop filter 326 are input to the first phase shifter 304. In this embodiment, if the input clock signal is a single-component signal, the second phase shifter 310 may be arranged to provide its output signal to first phase shifter 304 as a plurality of components or phase signals offset in phase relative to one another. Alternatively, if the input clock signal includes plural phase signals, the second phase shifter 310 may be arranged to shift the phases of all of these components. The circuit of FIG. 6 provides a composite transfer function as discussed above. In this embodiment, the phase detector 324 is common to both control loops. Therefore, references to phase shifters as "first" or "second" should not be understood as implying order within a series of phase shifters. However, in typical applications, it is preferred to place the first phase shifter associated with the digital loop filter upstream or closest to the reference clock. A single phase detector as shown in FIG. 6 can be applied regardless of the order of the phase shifters.

Figure 7:
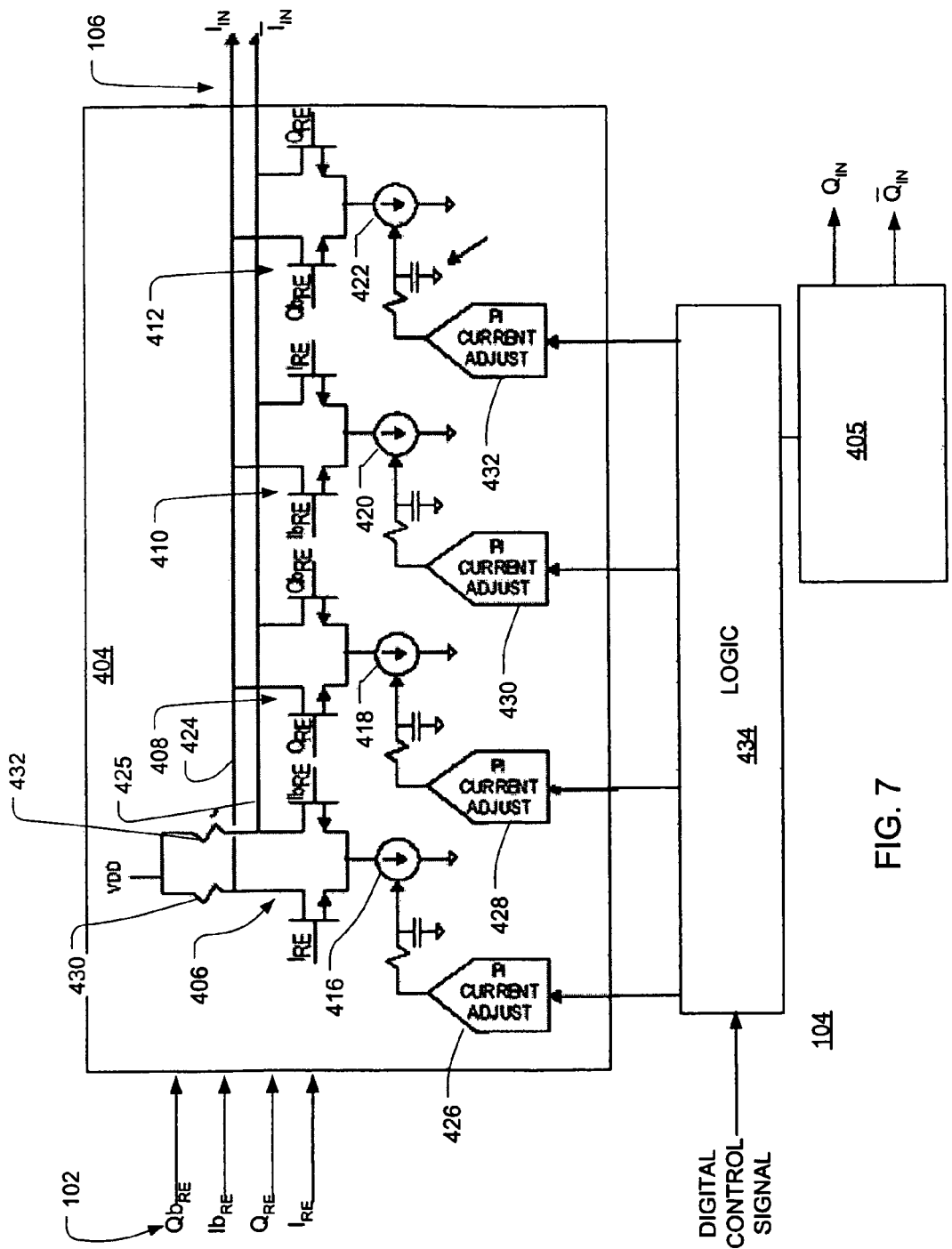
FIG. 7 is a schematic, partially block diagrammatic view of one phase shifter usable in the embodiment of FIG. 1.

One implementation of the first phase shifter 104 shown in FIG. 1 is depicted in greater detail in FIG. 7. As shown in FIG. 7, the input 102 of the first phase shifter is arranged to receive a reference clock signal in the form of $I_{RE}$ (0°), $Q_{RE}$ (90°), $Ib_{RE}$ (180°) and $Qb_{RE}$ (270°) phase signals or components. These components are connected to the gates of four differential pairs of transistors 406, 408, 410 and 412 of a combining circuit 404, also referred to as a phase interpolator. The connection paths between input 102 and the gates of the transistors are omitted for clarity of illustration in FIG. 7. Pair 406 has the source connections of the two transistors connected in common through a current source 416. The drain of one transistor is connected to a first output line 424. The drain of the opposite transistor in the same pair 406 is connected to an opposite output line 425. Pairs 408, 410 and 412 are connected in the same manner through current sources 418, 420 and 422. The output lines 424 and 425 are connected to a voltage source through load resistors 430 and 432. The components Ib, $I_{RE}$, $Q_{RE}$, and $Qb_{RE}$, derived from the reference clock signal, are connected to the gates of the various pairs. For example, pair 406 has one gate connected to component $I_{RE}$ and the other gate connected to the inverse component $IB_{RE}$. Accordingly, current flowing through source 416 will appear as a voltage across lines 424 and 426 having a phase associated with component $I_{RE}$. Stated another way, the connected signals $I_{RE}$ and $Ib_{RE}$ at pair 406 constitute a first or 0° signal which contributes an output component defined as 0° phase angle. In exactly the same manner, signals $Q_{RE}$ and $Qb_{RE}$ are applied to differential pair 408 and contribute an output component 900 out-of-phase with the output signal from pair 406. Pair 410 receives signals $Ib_{RE}$ and $I_{RE}$, but the connections of these signals are reversed relative to the connections used with pair 406, so that current flowing through 410 and the associated current source 420 contributes an output component 180° out-of-phase with the output signal from pair 406 to the signal on line 424. Likewise, pair 412 receives components $Qb_{RE}$ and $Q_{RE}$, but has connections reversed relative to pair 408, so that current flowing in pair 412 and source 422 will contribute an output component 180° out-of-phase with the output signal from pair 408 and, hence, 270° out-of-phase with the output signal from pair 406. All of these components are summed by the action of resisters 430 and 432 to provide an intermediate signal component $I_{IN}$ and its complement $\bar{I}_N$ on lines 424 and 425 respectively.

Current sources 416, 418, 420 and 422 are controlled by digital-to-analog converters 426, 428 430 and 432 respectively, which supply analog signals to the current sources optionally through resistor capacitor networks. Logic circuit 434 (equivalent to logic circuit 134 shown in FIG. 1) receives a digital control signal indicating the desired phase shift and supplies a value to each digital-to-analog converter 426-432.

The currents produced by sources 416-422 represent the coefficients to be applied to the various phase signals as discussed above. For example, the current provided by source 418 represents the coefficient to be multiplied with the 90° phase signal at pair 408. For a desired phase shift within the active domain of the 90° phase signal (between 0° and 180°), the logic unit 434 supplies digital-to-analog converter 428 with a value which is at a maximum for a desired phase shift of 90° and which decreases progressively as the difference between the desired phase shift and 90° increases. Thus, the component applied by pair 408 associated with the 90° phase signal is at a maximum when the desired phase shift equals 90° and decreases progressively as the desired phase shift approaches 0° or 180°. For desired phase shift outside of the 0° to 180° active domain, logic circuit 434 supplies a value of zero to digital-to-analog converter 428, and hence, the current passing through pair 408 is 0 and the 90° phase signal ($Q_{RE}$ and $Qb_{RE}$, as applied to pair 408) is deselected. The logic circuit 434 operates in exactly the same way with regard to each of the other digital-to-analog converters 426, 430 and 432, using different active domains, so that the 0° phase signal at pair 406 is selected and supplied with a non-0 coefficient, over the active domain of 270-90°; the 180° phase signal at pair 420 is selected over the active domain 90°-270°, whereas the 270° phase signal at pair 412 is selected over the active domain 180°-360°. Thus, for any given phase shift specified by the digital control signal, only two of the differential pairs 406-412 and only two phase signals are selected and active. In the special case where the specified phase shift is exactly 0°, 90°, 180° or 270°, only one differential pair is active, and only one phase signal is selected. The resultant signal on lines 424 and 425 constitutes the output 106 of the first phase shifter.

In some cases, it is desirable to provide the output signal from the first phase shifter in the form of a clock signal having in-phase and quadrature components 900 out-of-phase with one another. In this case, the first phase shifter 104 may include a second combining circuit 405 and controlled by logic circuit 434 in the same manner as circuit 404, except that the logic circuit 434 adds 90° to the desired phase shift before computing the values to be supplied to the digital-to-analog converters. The same result may be obtained by rearranging the connections between the logic circuit and the various digital-to-analog converters of the second combining circuit 405, so that the value which is applied to the digital-to-analog converter 428 associated with the 90° phase signal in the first combining circuit is routed to the digital-to-analog converter associated with the 180° phase signal in the second combining circuit 405, and so on. Alternatively, the connections of the various components $Ib_{RE}$, $I_{RE}$, $Q_{RE}$ and $Qb_{RE}$ may be interchanged. The second combining circuit 405 produces the quadrature component $Q_{IN}$ and $Q^-_{IN}$, and the output 106 of the first phase shifter includes these components as well. Other circuits capable of selecting and interpolating phase signals are known in the art, and these circuits can be used instead of the particular implementation discussed above with reference to FIG. 7.

An implementation of the second phase shifter 110 using phase interpolators is shown in FIG. 8. This circuit incorporates a first stage consisting of phase interpolators 512 and 514 operating in parallel, and a second stage consisting of phase interpolators 516 and 518, also operating in parallel. All of the phase interpolation circuits are controlled by bias signals denoted A and B from a conversion circuit 520. The conversion circuit is arranged to receive the analog control signal as a differential signal including components V+ and V−. The conversion circuit includes a pair of current mirrors connected to a pair of transistors 526 and 528. The gates of the transistors are connected to operational amplifiers 522 and 524, whereas the sources of transistors 526 and 528 are connected to one another by a resistor $R_1$. The positive input of operational amplifier 522 is connected to the one side (V+) of the differential analog control signal, whereas the positive input of the opposite operational amplifier 524 is connected to the opposite (V−) side of the differential analog control signal. The negative inputs of the operational amplifiers are connected to the opposite sides of resistor $R_1$. With the analog control signal at a condition with V+ maximum and V− minimum, substantially all of the current from both current mirrors passes through transistor 528, and accordingly, the signal at node A is at a maximum and the signal at node B is at a minimum. As V+ decreases and V− increases, progressively more current passes through transistor 526, thus increasing the signal at node B and decreasing the signal at node A. The two operational amplifiers 526 and 528, in cooperation with resistor $R_1$, linearize the process so that the difference between the signals appearing at nodes A and B varies substantially linearly with the differential voltage of the analog control signal, i.e., the difference between V+ and V−.

Each interpolation circuit 512-516 operates in substantially the same way as the combining circuit 504 discussed above. Circuit 512 interpolates between intermediate signals $I_{IN}$ and $Q_{IN}$ to yield an interpolated signal $I_{OUT}$ and its complement $\overline{I}_{Out}$, whereas circuit 514 interpolates between $Q_{IN}$ and $\overline{I}_{IN}$ to yield a resultant $Q_{OUT}$ and its complement $Q^-_{OUT}$. Thus, the first stage interpolators 512 and 514 produce a replica of $I_N$ and $Q_N$ phase delayed up to 90°. The second stage interpolators apply a further phase delay of up to 90°. Interpolator 516 interpolates between $I_{OUT}$ and $Q_{OUT}$ to produce a resultant $I_{DELAY}$, whereas phase shifter 518 interpolates between $Q_{OUT}$ and $\overline{I}_{OUT}$ to produce a resultant $Q_{DELAY}$ in quadrature with $I_{DELAY}$. The delays applied by all of the interpolators increase or decrease in unison as the analog control signal increases. The phase relationships of these signal components are as seen in FIG. 9. $I_{DELAY}$ and $Q_{DELAY}$ constitute the recovered clock signal. The recovered clock signal may also include the complements of these signals. Where only 90° phase delay is required in the analog phase shifter, the second stage (circuits 516 and 518) can be omitted; in this case, $I_{OUT}$ and $Q_{OUT}$ from circuits 512 and 514 (with or without their complements) constitute the recovered clock signal. In a further variant, additional stages can be added to provide more than 180° maximum phase delay.

Another implementation of the analog phase shifter is shown in FIG. 10; this implementation includes a chain of inverters, buffers, or other logic gates in series, so that the clock signal passes through all of the gates. The delay imparted by each gate is directly related to the control voltage applied to the gate.

One implementation of an analog phase detector and analog loop filter is shown in FIG. 11. The analog phase detector per se is similar to that shown in Hogge, "A Self-Correcting Clock Recovery Circuit," J. Lightwave Technology, Vol. LT-3, No. 6, December 1985, pp. 1312-1314. This circuit includes a first flip-flop 602 and a second flip-flop 604 clocked by complementary components of the recovered clock signal, such as $I_{DELAY}$ and its complement $\overline{I}_{DELAY}$. For use in this particular analog phase detector, each component should have a frequency equal to the inverse of the data time intervals. Where the recovered clock signal includes plural components each having a period equal to two data intervals, the analog phase detector according to this embodiment may include an appropriate circuit (not shown) for forming complimentary components having the proper periods from the various components of the recovered clock signals. The data signal input is connected to the D input of the first flip-flop 602, whereas the Q output of flip-flop 602 is connected to the D input of the second flip-flop 604. A first exclusive OR (XOR) gate 606 has inputs connected to the data signal input 116 and to the Q output of first flip-flop 602. A second XOR gate 608 has inputs connected to the Q output of the first flip-flop and the Q output of the second flip-flop. The output of the first XOR gate 606 is connected to a first charge pump 610, whereas the output of the second XOR gate 608 is connected to a similar charge pump 612 which acts in the opposite sense. Charge pump 610 tends to remove charge from capacitor 614, whereas charge pump 612 tends to add charge. The loop filter includes a capacitor 614 and resistor 616 connected in parallel between a circuit node 618 and ground or other source of reference potential. If the clock $I_{DELAY}$ is precisely centered relative to the data intervals in the data signal, the outputs from XOR gate 606 and 608 will be high (logic 1) for equal intervals, and hence the charge pump 610 and 612 operate for equal times so that no net charge will be added to capacitor 614. However, if the clock signal is advanced relative to the data signal, the output from the first XOR gate 606 will be high (logic 1) for a shorter time than the output from the second XOR gate 608, so that charge pump 612 will operate for a longer time than charge pump 610 on each transition of the data. This will add charge to capacitor 614, and hence, increase the analog control signal. Capacitor 614 integrates the results over numerous data transitions. In the absence of transitions in the data signal, the outputs from the XOR gates will remain low, and neither charge pump will operate.

Figure 12:
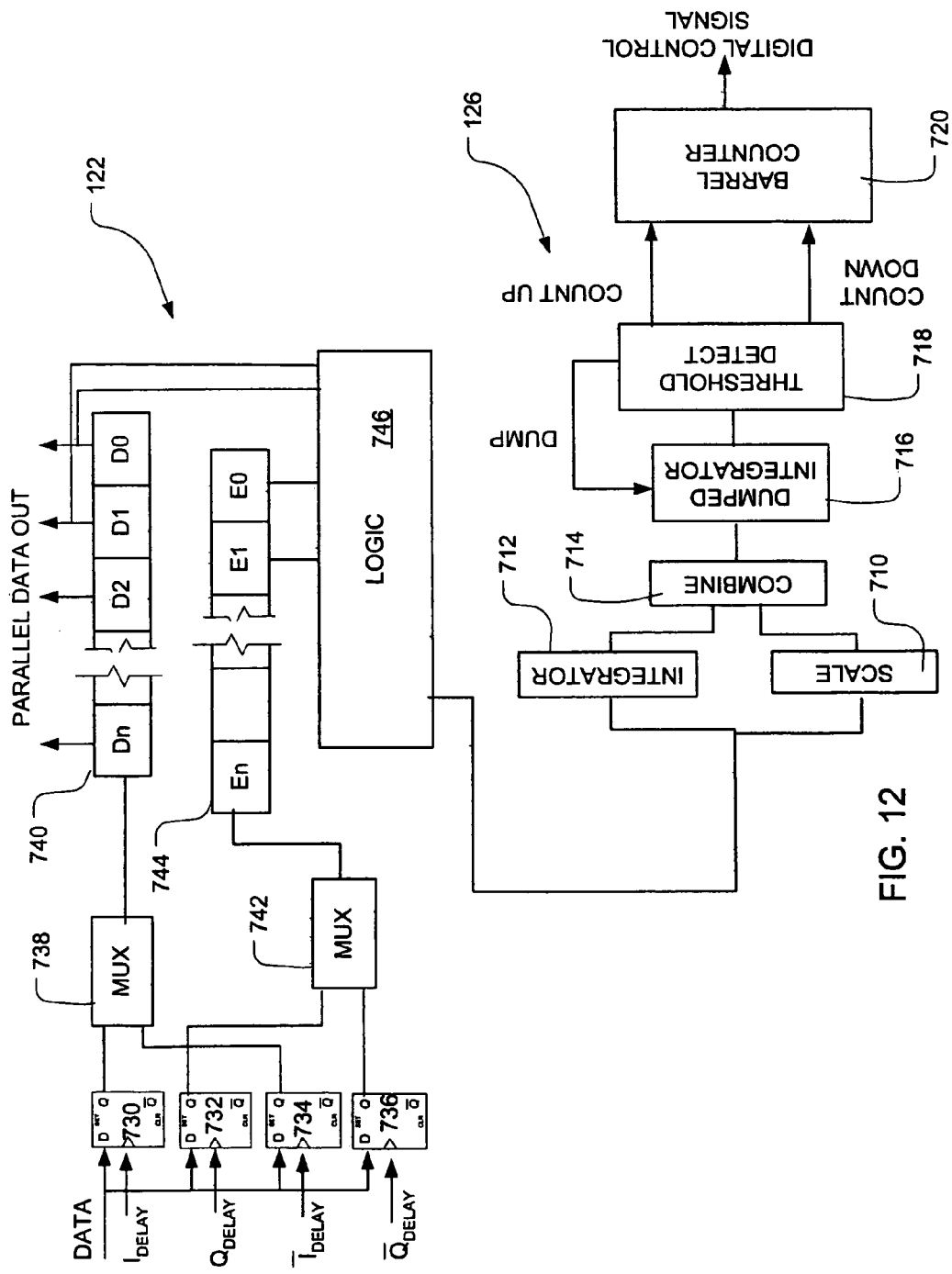
FIG. 12 is a schematic, partially block diagrammatic view of one digital phase detector and digital loop filter usable in the embodiment of FIG. 1.

An implementation of the integrated data sampler 120, digitizer 121 and digital phase detector 122 and digital loop filter 126 is shown in FIG. 12. This implementation uses a recovered clock signal having components $I_{DELAY}$ and $Q_{DELAY}$ in quadrature with one another and their complements $\overline{I}_{DELAY}$ and $Q^-_{DELAY}$, as depicted in FIG. 13A. Each component has a period equal to two data intervals. In the ideal locked condition shown in FIG. 13A, components $I_{DELAY}$ and $\overline{I}_{DELAY}$ are aligned in the centers of successive data intervals, whereas components $Q_{DELAY}$ and $Q^-_{DELAY}$ are aligned with the boundary or edges between successive data intervals. The serial data input is connected to latch 730, clocked by clocked by $I_{DELAY}$; to latch 732, clocked by $Q_{DELAY}$; to latch 734 clocked by $\overline{I}_{DELAY}$; and to latch 736, clocked by $Q^-_{DELAY}$. Accordingly, in the locked condition shown in FIG. 13A, latches 730 and 734 will sample the serial data signal in alternate data intervals, referred to herein as "even" and "odd" data intervals, whereas latches 732 and 736 will sample the serial data signal at alternate even and odd boundaries between data intervals. Thus, the components $I_{DELAY}$ and $\overline{I}_{DELAY}$ can be referred to as even and odd data clocks, whereas components $Q_{DELAY}$ and $Q^-_{DELAY}$ can be referred to as even and odd edge clocks.

The outputs of latches 730 and 734, clocked by the data clocks, are connected through a multiplexer 738 to the input of a shift register 740, referred to herein as the data register. Thus, as the latches and multiplexer operate, 1 or 0 values from latches 730 and 732, representing samples taken during successive even and odd data intervals, will be clocked into register 740. The outputs of latches 732 and 736, clocked by the edge clocks, are connected through another multiplexer 742 to a shift register 744, referred to herein as the edge register. Each shift register is arranged to hold n bits, where n is equal to the number of bits in a byte of parallel data. Thus, after n data intervals, data register 740 will hold data as shown in FIG. 12, with an even bit D0 representing the sample taken during a first, even data interval in the first position, an odd bit D1 representing the sample D1 taken during the next, odd data interval, and so on. Similarly, the first position in edge register 744 will hold a first, even bit E0 representing the sample taken at the boundary between the first and second data intervals, i.e., at the boundary between the data intervals represented by bits D0 and D1. Likewise, the second position in edge register 744 will hold an odd bit E1 representing the sample taken at the boundary between the data intervals represented by bits D1 and D2, and so on.

Data register 740 is arranged to supply all of the bits together, as the parallel data output of the deserializer. The data and edge registers 740 and 744 also are connected to a logic circuit 746. Logic circuit 746 is arranged to perform an exclusive or (XOR) operation between each data bit in data register 740 and the next succeeding bit in the data register to derive a transition detect signal. The logic circuit 746 is also arranged to perform an XOR operation between each data bit in data register 740 and the corresponding edge bit in register 744 to provide an early/late signal. For example, the XOR of D0 and D1 provides a transition detect signal associated with D0, whereas the XOR of D0 and E0 provides an early/late signal associated with D0. Logic circuit 746 is arranged to provide a count value for each byte equal to the number of early/late signals for that byte having value 1 minus the number of early/late signals which have value 0. However, the logic circuit is arranged to exclude from the count the early/late signal associated with each data bit if the transition detect signal associated with that data bit is 0. A positive number indicates that the clock is late relative to the data signal, whereas a negative number indicates that the clock is early relative to the data signal.

The operation of the digital phase detector of FIG. 12 can be better understood with reference to FIGS. 13A-13D. In a perfectly locked condition (FIG. 13A), each edge sample represented by the bits in the edge register is taken precisely at the boundary between data intervals. The voltage used to represent digital 1 or 0 has an indeterminate value, somewhere between the high value representing 1 and the low value representing 0. Thus, when latch 732 or latch 736 samples the signal, the probability the digital value output by the latch will be 1 is equal to the probability that the value will be 0. Therefore, the number of 0 early/late signals generated by the logic circuit will be equal to the number of 1 early/late signals.

Where the clock is early (FIG. 13B), each edge bit represents a sample taken during the immediately preceding data interval, rather than at the boundary or edge between data intervals. Therefore, each edge bit in register 744 will have the same value as the corresponding data bit in register 740, and hence each early/late signal will be 0. Where the clock is late (FIG. 13C), each edge bit represents a sample taken during the immediately succeeding data interval, rather than at the boundary between data intervals. If there is a transition in the data between these intervals, the edge bit will have a value different from the corresponding data bit, and the early/late signal will be 1.

If there is no transition between two successive data intervals, so that the data bits are the same, the edge bit will have the same value as the data bits regardless of whether the clock is early or late, and the early/late signal will be 0. However, in this case, the transition signal will also be 0 and the early/late signal is ignored.

The count from logic circuit 746 is supplied to a scaling factor unit which supplies a value equal to the value from register 718 multiplied by a scaling factor, and to an integrator 712 which integrates the value supplied by register 708 over time and applies an appropriate scaling factor. The output of integrator 712 and scaling factor unit 710 are periodically sampled by a combining circuit 714. The combined value from unit 714, thus, represents a combination of a first-order signal from scaling unit 710 representing substantially instantaneous clock signal lead or lag, and a second-order component from integrator 712 representing the integral of the lead or lag over time. Combining unit 714 supplies each such combined value to a dumped integrator 716 linked to a threshold detection unit 718, which, in turn, is linked to a barrel counter 720. Integrator 716 accumulates a total representing all of the signals from combining unit 714. If the total reaches a positive threshold, threshold detection unit 718 issues a count-up signal to barrel counter 720 and a dump signal to integrator 716, which resets the integrator to 0. If the total reaches a negative threshold, the threshold detection unit 718 issues a count-down signal to barrel counter 720 and also resets the integrator 716 to 0. Counter 720 holds a count value; it increments the count by a preselected increment for each count-up signal and decrements the count by the same increment for each count-down signal. Counter 720 counts along a circular scale corresponding to 360°. Thus, assuming that the barrel counter is operating with a 1° increment and the current count is 359°, the count will be reset to 0 if a count-up signal is received. Similarly, if the count is currently 0°, the count will be reset to 359° if a count-down signal is received. The output of the barrel counter constitutes the digital control signal.

The particular implementation shown in FIG. 13 can be varied. For example, combiner 714 can be replaced by a multiplexor which can be actuated to select either the second order signal from integrator 712 or the first order signal from scale factor 710, so as to provide only a first-order characteristic or only a second-order characteristic. Also, the scale factor unit 710 may be omitted entirely if only a second-order characteristic is desired, and integrator 712 may be omitted if only a first-order characteristic is desired. The components of the digital phase detector may be replaced by other circuits which perform the equivalent operation of edge detecting the data signal and multiplying the clock signal by the edge detection signal. See "Monolithic Phase-Locked Loops And Clock Recovery Circuits—Theory And Design," Razavi, ed., February 1996, pp. 33-35. The digital loop filter will retain a fixed value for the digital control signal, even during a prolonged absence of transitions in the data signal.

The particular embodiments shown above are merely illustrative. For example, the circuitry discussed above can be implemented in any desired form as, for example, as TTL or CMOS circuitry. The invention can be applied to data signals other than electrical signals as, for example, optical data signals. Also, the invention can be applied to data signals other than binary signals as, for example, in multi-level signaling, also referred to as pulse amplitude modulation signaling. For example, in a PAM 3 signal, the value or characteristic of the data signal may have any one of three values during each data interval. In the embodiments discussed above, the data signal is a signal sent by a sending device outside of the monolithic integrated circuit which incorporates the clock recovery circuit. However, the same clock recovery circuit can be employed where the data signal is sent from another portion of the same monolithic integrated circuit.

As these and other variations and combinations of the features discussed above can be utilized without departing from the present invention as defined by the claims, the foregoing description of the preferred embodiments should be taken by way of illustration rather than by way of limitation of the invention as defined by the claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A circuit configured to generate a clock locked to a data signal, comprising:
   a first phase adjustment loop that adjusts phase of the clock through a finite phase range in manner responsive to detected phase difference between the clock and the data signal; and
   a second phase adjustment loop that stepwise adjusts phase of the clock responsive to detected phase difference between the clock and the data signal over an infinite range, the second phase adjustment loop to alter phase in a manner to vary effectively frequency of the clock to lock the clock to the data signal; and
   at least one phase interpolator that receives a plurality of phase signals that are of equal frequency but are offset in phase relative to one another, and that mixes the plurality of phase signals in response to a phase difference detected by at least one of the first phase adjustment loop and the second phase adjustment loop to produce the clock;
   wherein the first phase adjustment loop has a significantly shorter loop delay than the second phase adjustment loop, such that the first phase adjustment loop and second phase adjustment loop cooperate to vary both frequency and phase of the clock to minimize difference in phase between the clock and the data signal.

2. The circuit of claim 1, wherein the second phase adjustment loop includes a digital phase detector that quantizes phase difference between the clock and the data signal.

3. The circuit of claim 2, wherein the first phase adjustment loop adjusts phase of the clock in a manner proportional to detected phase difference between the clock and the data signal.

4. The circuit of claim 2, wherein the first phase adjustment loop adjusts phase of the clock through a limited range of no more than three-hundred-sixty degrees.

5. The circuit of claim 1, wherein the first phase adjustment loop includes a first phase shifter that adjusts phase to produce an intermediate signal, and where the second phase adjustment loop includes a second phase shifter that receives the intermediate signal as an input and adjusts phase of the intermediate signal.

6. The circuit of claim 1, wherein the at least one phase interpolator is configured to receives at least three phase signals that are of equal frequency but are offset in phase relative to one another, and that mixes the at least three phase signals in response to phase difference detected by at least the first phase adjustment loop to produce the clock.

7. The circuit of claim 1, wherein the at least one phase interpolator is configured to receives at least three phase signals that are of equal frequency but are offset in phase relative to one another, and that mixes the at least three phase signals in response to phase difference detected by at least the second phase adjustment loop to produce the clock.

8. The circuit of claim 1, further comprising a sampler and a deserializer, each of the first phase adjustment loop, the second phase adjustment loop, and the deserializer coupled to receive an output of the sampler.

9. The circuit of claim 1, wherein the second phase adjustment loop is a bang-bang loop.

10. The circuit of claim 1, wherein the first phase control loop has high control bandwidth and is adapted to mitigate jitter peaking produced by the second control loop acting alone.

11. The circuit of claim 1, wherein the second control loop includes an analog delay line.

12. The circuit of claim 1, wherein the circuit is embodied in a monolithic integrated circuit.

13. The circuit of claim 1, wherein:
   the circuit further includes multiple input data signals and a corresponding multiplicity of samplers; and
   each sampler has an associated phase adjustment loop that receives at least one timing reference and aligns a sampling clock to the corresponding data input signal.

14. The circuit of claim 13, wherein at least one of the associated phase adjustment loops is a delay locked loop.

15. The circuit of claim 13, wherein plural ones of the multiple input data signals are arranged in parallel for communication between a common sending device and a common receiving device and where an output of the associated phase adjustment loop is distributed to samplers used to sample the plural ones in substantial synchronism.

16. The circuit of claim 13, wherein plural ones of the multiple input data signals are arranged for communication between different sending devices and a common receiving device.

17. The circuit of claim 1, wherein the data signal is a differential signal.

18. The circuit of claim 1, wherein the second phase adjustment loop includes an integrator and responds to cumulative phase difference between the clock and the data signal.

19. The circuit of claim 1, wherein:
   the first phase adjustment loop includes a first phase shifter;
   the second phase adjustment loop includes a second phase shifter; and
   the first phase shifter and the second phase shifter process a timing reference in series to generate the clock, such that phase adjustment by each of the first shifter and second phase shifter are additive.

20. The circuit of claim 1, wherein:
   the circuit further comprises a phase generator that receives an input clock signal and generates multiple replica clock signals of like frequency but with fixed phase difference relative to others of the multiple replica clock signals; and
   the second phase adjustment loop includes an interpolator controlled to stepwise increase or decrease phase of the clock signal by selecting between the multiple replica clock signals in response to detected phase difference.

21. The circuit of claim 1, wherein the first phase control loop has high control bandwidth and is adapted to mitigate dither jitter produced by the second control loop acting alone.

22. A circuit configured to receive multiple data signals from one or more sending devices, comprising:
   a receiver for each one of the multiple data signals;
   a phase generation circuit to generate plural phase signals; and for each sending device:
- a clock generation element that generates a clock from the plural phase signals,
- a first phase adjustment loop that adjusts phase of the clock through a finite phase range in manner responsive to detected phase difference between the clock and at least one data signal from the corresponding sending device, and
- a second phase adjustment loop that stepwise adjusts phase of the clock responsive to detected phase difference between the clock and the at least one data signal over an infinite range, the second phase adjustment loop to alter phase in a manner to vary effectively frequency of the clock to lock the clock to the at least one data signal from the corresponding sending device;
- wherein the clock generation element includes at least one phase interpolator;
- wherein for each sending device the first phase adjustment loop has a significantly shorter loop delay than the second phase adjustment loop, such that the first phase adjustment loop and second phase adjustment loop cooperate to vary both frequency and phase of the clock signal to minimize difference in phase between the clock signal and the at least one data signal.

23. The circuit of claim 22, wherein for each one of the multiple data signals, the circuit includes:
- a clock generation element that generates a clock from the plural phase signals;
- a first phase adjustment loop that adjusts phase of the clock through a finite phase range in manner responsive to detected phase difference between the clock and a corresponding one of the multiple data signals; and
- a second phase adjustment loop that stepwise adjusts phase of the clock responsive to detected phase difference between the clock and the corresponding one of multiple data signals over an infinite range, the second phase adjustment loop to alter phase in a manner to vary effectively frequency of the clock to lock the clock to the corresponding one of the multiple data signals.

24. The circuit of claim 22, wherein the at least one phase interpolator is controlled in response to the associated first phase adjustment loop.

25. The circuit of claim 22, wherein the at least one phase interpolator is controlled in response to the associated second phase adjustment loop.

26. The circuit of claim 22, wherein each second phase adjustment loop includes a digital phase detector that quantizes phase difference between the clock and the data signal.

27. The circuit of claim 22, wherein each first phase adjustment loop adjusts phase of the clock in a manner proportional to detected phase difference between the clock and the data signal.

28. The circuit of claim 22, wherein each clock generation element receives at least three phase signals that are of equal frequency but are offset in phase relative to one another, and mixes the at least three phase signals in response to phase difference detected by at least the first phase adjustment loop to produce the associated clock.

29. The circuit of claim 22, wherein each receiver includes a sampler and a deserializer, where for each sending device an associated first phase adjustment loop and an associated second phase adjustment loop receive a sampler output.

30. The circuit of claim 22, wherein the circuit is embodied in a monolithic integrated circuit device.

31. A circuit, comprising:
- a timing signal generator that produces plural, different timing signals;
- one or more samplers to receive and sample a number of data signals corresponding to the number of samplers;
- for at least one of the data signals, means for using at least two phase adjustment loops, including at least a first phase adjustment loop to adjust phase of a clock through a finite phase range responsive to detected phase difference between the clock and the corresponding data signal, and including a second phase adjustment loop that stepwise adjusts phase of the clock responsive to second order detected phase difference between the clock and the data signal over an infinite range, the second phase adjustment loop to alter phase in a manner to vary effectively frequency of the clock to lock the clock to the data signal; and
- wherein the first phase adjustment loop has a significantly shorter loop delay than the second phase adjustment loop, such that the first phase adjustment loop and second phase adjustment loop cooperate to vary both frequency and phase of the clock to minimize difference in phase between the clock and the data signal.

32. The circuit of claim 31, further comprising means for all of the data signals for using at least two phase adjustment loops, including at least a first phase adjustment loop to adjust phase of a clock through a finite phase range responsive to detected phase difference between the clock and the corresponding data signal, and including a second phase adjustment loop that stepwise adjusts phase of the clock responsive to second order detected phase difference between the clock and the data signal over an infinite range, the second phase adjustment loop to alter phase in a manner to vary effectively frequency of the clock to lock the clock to the data signal.

33. A method of generating a clock locked to a data signal, comprising:
- adjusting phase of the clock using a first phase adjustment loop through a finite phase range in manner responsive to detected phase difference between the clock and the data signal;
- adjusting phase of the clock in a stepwise manner using a second phase adjustment loop in response to detected phase difference between the clock and the data signal over an infinite range, to alter phase in a manner to vary effectively frequency of the clock to lock the clock to the data signal;
- employing for the first phase adjustment loop a significantly shorter loop delay than for the second phase adjustment loop, such that the first phase adjustment loop and second phase adjustment loop cooperate to vary both frequency and phase of the clock to minimize difference in phase between the clock and the data signal; and
- receiving a plurality of phase signals by at least one phase interpolator, wherein the plurality of phase signals are of equal frequency but are offset in phase relative to one another, and that mixes the plurality of phase signals in response to a phase difference detected by at least one of the first phase adjustment loop and the second phase adjustment loop to produce the clock.

34. A circuit configured to generate a clock locked to a data signal, comprising:
- a first phase adjustment loop that adjusts phase of the clock through a finite phase range in manner responsive to detected phase difference between the clock and the data signal; and a second phase adjustment loop that stepwise adjusts phase of the clock responsive to detected phase difference between the clock and the data signal over an infinite range, the second phase adjustment loop to alter phase in a manner to vary effectively frequency of the clock to lock the clock to the data signal;

where the first phase adjustment loop has a significantly shorter loop delay than the second phase adjustment loop, such that the first phase adjustment loop and second phase adjustment loop cooperate to vary both frequency and phase of the clock to minimize difference in phase between the clock and the data signal; and a sampler and a deserializer, each of the first phase adjustment loop, the second phase adjustment loop, and the deserializer coupled to receive an output of the sampler.

\* \* \* \* \*